United States Patent
Bailey et al.

(10) Patent No.: US 11,602,082 B2
(45) Date of Patent: Mar. 7, 2023

(54) DATA CENTER THAT REGULATES AIR PRESSURE WITHIN AN INTERIOR COMPARTMENT

(71) Applicant: DELL PRODUCTS, L.P., Round Rock, TX (US)

(72) Inventors: Mark M. Bailey, Round Rock, TX (US); Trey S. Wiederhold, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 340 days.

(21) Appl. No.: 16/743,227

(22) Filed: Jan. 15, 2020

(65) Prior Publication Data
US 2021/0219460 A1 Jul. 15, 2021

(51) Int. Cl.
*H05K 7/20* (2006.01)
*H05K 7/14* (2006.01)
*H05K 5/02* (2006.01)

(52) U.S. Cl.
CPC ....... *H05K 7/20745* (2013.01); *H05K 5/0213* (2013.01); *H05K 7/1481* (2013.01); *H05K 7/1497* (2013.01); *H05K 7/20754* (2013.01); *H05K 7/20836* (2013.01)

(58) Field of Classification Search
CPC ............. H05K 7/20745; H05K 7/1481; H05K 7/1497; H05K 7/20754; H05K 7/20836; H05K 7/1488; H05K 7/20; H05K 7/20136; H05K 7/20181; H05K 5/0213
USPC ........................................................ 454/184
See application file for complete search history.

(56) References Cited

U.S. PATENT DOCUMENTS

| 7,857,688 | B1* | 12/2010 | Cunningham | ..... | H05K 7/20736 454/184 |
| 8,947,879 | B2 | 2/2015 | Broome et al. | | |
| 10,026,445 | B1* | 7/2018 | Gale | .................... | G11B 23/021 |
| 10,178,794 | B1 | 1/2019 | Bailey et al. | | |
| 2012/0281352 | A1* | 11/2012 | Namek | .............. | H05K 7/20745 361/679.46 |
| 2013/0128455 | A1* | 5/2013 | Koblenz | ............ | H05K 7/20836 361/692 |
| 2015/0003010 | A1* | 1/2015 | Kinstle, III | ........ | H05K 7/20736 361/679.49 |
| 2017/0325354 | A1* | 11/2017 | Lee | ...................... | H05K 5/0213 |

(Continued)

*Primary Examiner* — Steven B McAllister
*Assistant Examiner* — Charles R Brawner
(74) *Attorney, Agent, or Firm* — Isidore PLLC

(57) ABSTRACT

A data center provides containment walls of an operation technology (OT) interior compartment, such as a meet me room, positioned between cold and hot aisles in an information technology (IT compartment. The OT interior compartment limits air flow so that IT components outside of the OT interior compartment receive sufficient supply air for moderating or cooling a temperature of the IT components. Pressure differential is measured on an exterior and interior of door(s) to the OT interior compartment. Air flow regulation device(s) are positioned in a supply air passage to the OT interior compartment and/or in a return air passage out of the OT interior compartment are controlled to limit the pressure differential between an exterior and interior of the containment wall. Limiting the pressure differential ensures that door(s) facing the cold aisle are not difficult to open and door(s) facing the hot aisle are not difficult to close.

19 Claims, 9 Drawing Sheets

(56) References Cited

U.S. PATENT DOCUMENTS

| | | |
|---|---|---|
| 2017/0339804 A1* | 11/2017 | Ingalz ................. H05K 7/20736 |
| 2017/0359922 A1 | 12/2017 | Bailey et al. |
| 2018/0014434 A1 | 1/2018 | Craft, Jr. et al. |
| 2018/0077819 A1* | 3/2018 | Roy ................... H05K 7/20181 |
| 2018/0268862 A1* | 9/2018 | Gale ....................... G11B 33/02 |
| 2019/0150316 A1* | 5/2019 | Dayal ....................... G06F 1/20 |
| | | 361/679.48 |
| 2019/0166727 A1* | 5/2019 | Deev ...................... G05B 15/02 |
| 2019/0235449 A1* | 8/2019 | Slessman ............... G06F 9/5094 |
| 2021/0195803 A1* | 6/2021 | Ebermann .......... H05K 7/20736 |

* cited by examiner

DATA CENTER THAT REGULATES AIR PRESSURE WITHIN AN INTERIOR COMPARTMENT

BACKGROUND

1. Technical Field

The present disclosure generally relates to a data center with an environmental subsystem, and in particular to a data center with an environmental subsystem that regulates temperature and pressure within the data center.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large-scale information handling systems are organized in data centers. Information technology (IT) components within the data center store sensitive data and execute critical compute workloads. IT components consume the majority of the electrical power for the data center and thus have the majority of the cooling requirement. An efficient method of cooling includes positioning the IT components between a cold aisle and a hot aisle. A positive pressure differential between the cold and the hot aisle results in cooling airflow through the IT components. IT components are supported by operation technology (OT) components for infrastructure subsystems, such as security, network communications, fire suppression, power distribution, data center management, etc. In data centers, the space where vendors' equipment connect to one another and exchange data is known as the "meet-me-room" (MMR). A typical MMR is filled with cages and racks that house switches and servers linked by multiple cable connections. The racks and cages typically do not have a mechanism to control or direct airflow as most of the equipment does not produce substantial heat load and is passively cooled without the use of fans. The OT components, such as network communication equipment, and other IT equipment, are typically mounted in racks that are known as two post racks, as the vertical structural frame only consists of two posts. The two post racks do not provide any physical airflow containment from rack to rack. Because the two post racks offer no airflow containment within the rack, placing the two post racks in a traditional IT rack row lineup creates a hole in the containment system allowing all of the air to bypass the IT racks holding servers that require more cooling. In addition, the equipment housed in two post racks are often required to have physical separation from other vendor equipment as well as the traditional servers that reside on a data center floor. Therefore, IT/OT equipment mounted in two post racks is typically located in a separate room, such as an MMR, which do not include hot and/or cold aisle containment as in a traditional data center with IT equipment racks.

BRIEF SUMMARY

Disclosed are a data center, an environmental subsystem, and a method for regulating pressure of supply air provided to an interior compartment within an information technology (IT) space.

According to one embodiment, a data center is provided that regulates pressure of supply air provided to an interior compartment within an IT space. In one or more embodiments, the data center includes an IT compartment having a cold aisle and a hot aisle. An operation technology (OT) interior compartment is positioned in the IT compartment between the cold aisle and the hot aisle. Within the data center, a first door selectively opens the OT interior compartment to provide access from a first side of the OT interior compartment facing one of the cold aisle and the hot aisle. The first door provides access to the OT interior compartment and to OT component(s) that may be installed within the OT interior compartment. An environmental subsystem of the data center includes an air handling system that provides supply air to the cold aisle and that draws return air from the hot aisle. The supply air moderates or cools a temperature of IT component(s) that may be installed within the IT compartment and OT component(s) that may be installed within OT interior compartment. Within the data center, a supply air passage guides air from the cold aisle into the OT interior compartment. Within the data center, a return air passage guides air from the OT interior compartment to the hot aisle. Within the data center, at least one air flow regulation device is positioned in a selected one of the supply air passage and the return air passage. First pressure sensor(s) are positioned within the data center to sense a first differential air pressure value between an exterior and an interior of the OT interior compartment at the first side of OT interior compartment. Within the data center, a memory contains an air pressure limiting application. A controller of the data center is communicatively coupled to the at least one air flow regulation device and the memory. The controller executes the air pressure limiting application to enable the environmental subsystem to monitor the first differential air pressure value received from the first pressure sensor(s). The controller compares the first differential air pressure value to a first pressure threshold. In response to determining that the first differential air pressure is greater than the first pressure threshold, the controller actuates one or more of the at least one air flow regulation device to reduce the first differential air pressure value to below the first pressure threshold and to enable opening of the first door without requiring excess physical force.

According to a next embodiment, an environmental subsystem regulates pressure of supply air provided to an interior compartment within an IT space of a data center. In one or more embodiments, the environmental subsystem includes an OT interior compartment positioned between a cold aisle and a hot aisle in an IT compartment. The environmental subsystem includes a first door that selectively opens the OT interior compartment to provide access from a first side of the OT interior compartment facing a selected one of the cold aisle and the hot aisle. The access is provided to the OT interior compartment and to OT component(s) that may be installed within the OT interior compartment. The environmental subsystem includes an air handling system that provides supply air to the cold aisle and draws return air from the hot aisle of the IT compartment to moderate or cool a temperature of IT component(s) that may be installed within the IT compartment and the OT component(s) that may be installed within the OT interior compartment. The environmental subsystem includes a supply air passage that guides air from the cold aisle into the OT interior compartment. The environmental subsystem includes a return air passage that guides air from the OT interior compartment to the hot aisle. At least one air flow regulation device is positioned in a selected one of the supply air passage and the return air passage. First pressure sensor(s) are positioned to sense a first differential air pressure value between an exterior and an interior of the OT interior compartment at the first side of the OT interior compartment. The environmental subsystem includes a memory that stores an air pressure limiting application. The environmental subsystem includes a controller that is communicatively coupled to the at least one air flow regulation device and the memory. The controller executes the air pressure limiting application to enable the environmental subsystem to monitor the first differential air pressure value received from the first pressure sensor(s). The controller compares the first differential air pressure value to a first pressure threshold. In response to determining that the first differential air pressure is greater than the first pressure threshold, the controller actuates one or more of the at least one air flow regulation device to reduce the first differential air pressure value to below the first pressure threshold and to enable opening of the first door without requiring excess physical force.

According to another embodiment, a method for regulating pressure of supply air provided to an interior compartment within an IT space of a data center. In one or more embodiments, the method includes an air handling system of an environmental subsystem providing supply air to a cold aisle of an IT compartment of a data center having the IT compartment and an OT interior compartment. The method includes the air handling system drawing return air from a hot aisle of the IT compartment. The method includes providing a supply air passage that guides air from the cold aisle into the IT compartment and providing a return air passage that guides air from the OT interior compartment to the hot aisle. The method includes monitoring a first differential air pressure value received from first pressure sensor(s) positioned to sense a first differential air pressure value between an exterior and an interior of the OT interior compartment at a first side of the OT interior compartment. The OT interior compartment has a first door that selectively opens the OT interior compartment to provide access to the inside of the OT interior compartment from a first side of the OT interior compartment facing a selected one of the cold aisle and the hot aisle. The method includes comparing the first differential air pressure value to a first pressure threshold by a controller. In response to determining that the first differential air pressure is greater than the first pressure threshold, the method includes actuating one or more of the at least one air flow regulation device positioned in a selected one of the supply air passage and the return air passage to reduce the first differential air pressure value to below the first pressure threshold and to enable opening of the first door without requiring excess physical force.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
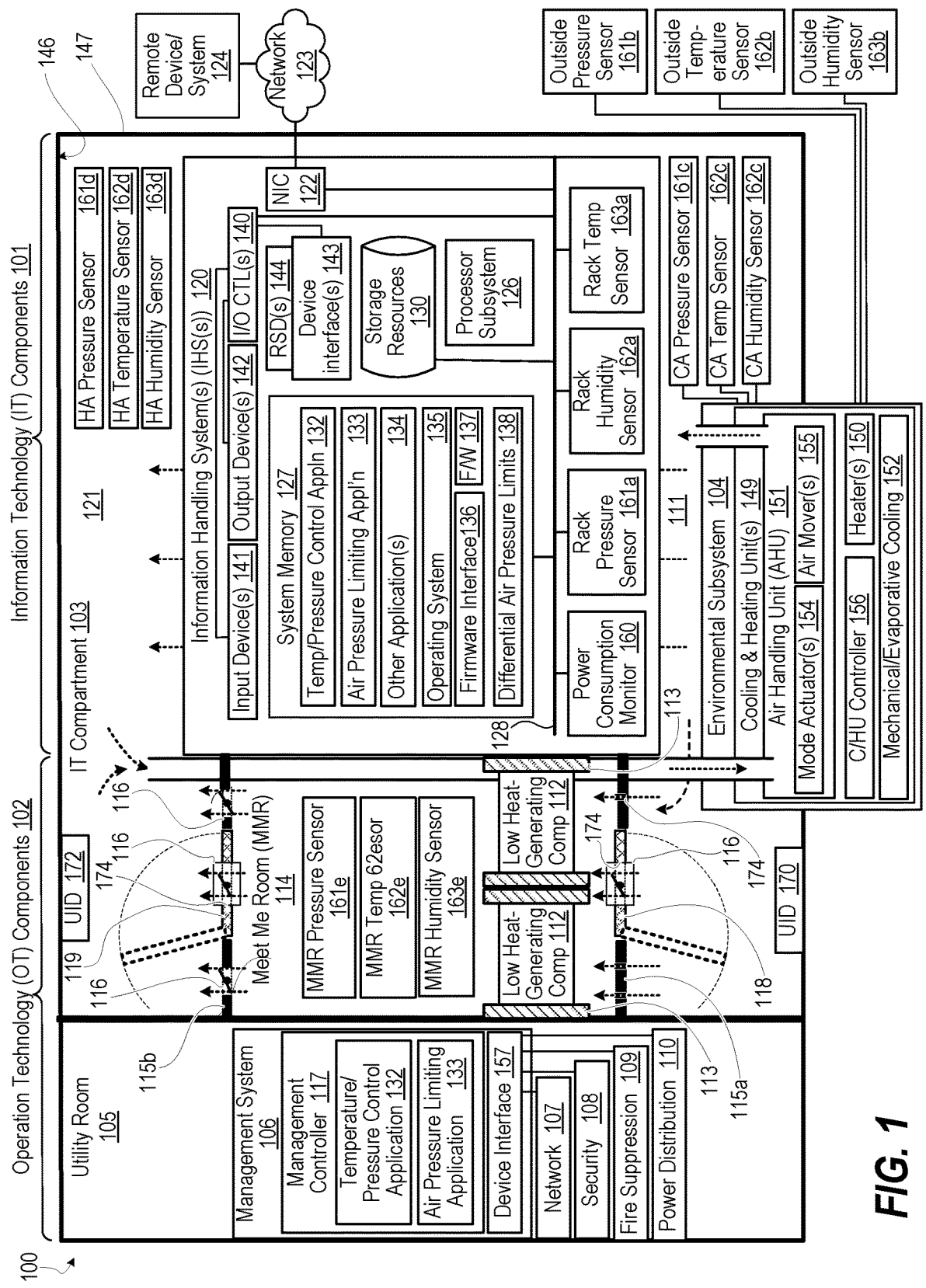
FIG. 1 depicts a simplified functional block diagram of a modular data center (MDC), according to one or more embodiments.

The illustrative embodiments provide a data center that includes containment walls of an operation technology (OT) interior compartment, such as a meet me room, positioned between cold and hot aisles in an information technology (IT) compartment. The OT interior compartment limits air flow so that IT components outside of the OT interior compartment receive sufficient supply air for moderating or cooling a temperature of the IT components. Pressure differential is measured on an exterior and interior of door(s) to the OT interior compartment. Air flow regulation device(s) are positioned in a supply air passage that leads into the OT interior compartment and/or in a return air passage that leads out of the OT interior compartment. The air flow regulation devices are controlled to limit the pressure differential between an exterior and interior of the containment wall.

Limiting the pressure differential ensures that door(s) facing the cold aisle are not difficult to open and door(s) facing the hot aisle are not difficult to close.

The present disclosure provides physical security and airflow management around "meet me room" (MMR) network equipment when placed into a traditional IT rack row between a hot aisle and a cold aisle within an IT compartment that contains airflow. Mounting MMR network equipment in a rack ("MMR rack") in the same space as the server IT equipment substantially reduces infrastructure cost, cabling cost, cabling infrastructure cost, and reduces the amount of network signal loss by avoiding running cables for long distances. A containment system of the MMR rack can actively or passively direct a given amount of airflow through a MMR equipment rack, when mounted in a data center IT rack row. The containment system also provides front and rear doors to provide a physical separation between vendor equipment and the server IT equipment in a data center. An example of vendor equipment is for telecommunication services for the data center. In one or more embodiments, the doors have vented openings that constrict the amount of air allowed to pass through the MMR rack.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a simplified functional block diagram of a data center, and in particular a modular data center (MDC) 100 having IT compartment 103 within which information technology (IT) components 101 and operation technology (OT) components 102 that are efficiently maintained within specified environmental operating conditions by environmental subsystem 104. Certain OT components 102 can be installed within a separate compartment such as utility room 105. Utility room 105 provides a higher degree of access to infrastructure support functions, such as management system 106, network subsystem 107, security subsystem 108, fire suppression subsystem 109, and power distribution subsystem 110.

Other OT components 102 have a requirement for separate containment. One reason for separate containment is that particular OT components 102 have different people authorized to access the OT components 102 (and/or IT components 101) in utility room 105 from the people authorized to access IT components 101 in IT compartment 103. Separate containment prevents access by personnel that are authorized to be in other parts of MDC 101 but are not authorized to access components/equipment, such as OT components 102, housed in separate compartments, e.g., utility room 105. Another reason for separate containment is to control air flow for OT components 102 that require air cooling. IT components 101 are efficiently cooled within IT compartment 103 that has air containment features. OT components 102 are typically low heat generating. OT components 102 and other low heat-generating components 112 are mounted to open two-post racks 113. The open two post racks 113 allow more unconstrained airflow than IT components 101. Placing OT components 102 and/or other low heat generating components 112. in such open two-post racks 113 alongside a rack of IT components 101 would result in a bypass of cooling airflow from IT components 101. To meet the security and/or air cooling requirements of these other OT components 102, low heat-generating components 112 mounted to open two-post racks 113 are housed in an interior OT compartment, such as a meet me room (MMR) 114. MMR 114 includes an enclosure having containment wall 115a facing cold aisle 111 and containment wall 115b facing hot aisle 121 of IT compartment 103. MMR 114 is configured to allow a portion of supply air to pass/enter through containment wall 115a and return air to pass/exit through containment wall 115b for regulating the temperature within MMR 114 and/or cooling low heat-generating components 112. First access door 118 is installed in containment wall 115a to enable access by personnel into MMR 114 from cold aisle 111 and vice-versa. Second access door 119 is installed in containment wall 115b to enable access by personnel into MMR 114 from hot aisle 121 and vice-versa. Air flow regulation device(s) 116 are inserted within one or both of supply air passage 174 and return air passage 176 at containment walls 115a and 115b, respectively. Management controller 117 of management system 106 controls/manages air flow regulation device(s) 116 in order to limit an air pressure differential between an exterior and an interior of corresponding first and second access doors 118, 119 in containment wall 115a in order to limit physical force of the air pressure differential that would otherwise make first access door 118 difficult to open and second access door 119 difficult to close (or vice-versa, depending on the swing of the access door 118, 119 into the MMR 114 or into the respective cold aisle 111 or hot aisle 121. Air flow regulation device(s) 116 are used to modulate the flow of air into and/or out of MMR 114. Modulating air flow directly controls the amount/value of air pressure differential between the exterior and the interior of access doors 118, 119.

Air flow regulation device(s) 116 also limit the amount of air flow entering MMR 114 to enable the majority of air flow to be directed through and not bypass IT components 101, such as information handling systems (IHSs) 120, within IT compartment 103. Within the general context of IHSs, IHS 120 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 120 may be a server, blade server, rack-mounted server, rack-mounted data storage, or other rack-mounted IT equipment. IHS 120 may include random access memory (RAM), one or more processing resources such as a central processing unit (CPU) or hardware or software control logic, read only memory (ROM), and/or other types of nonvolatile memory. Additional components of the IHS 120 may include one or more disk drives, one or more network ports for communicating with external devices as well as various input and output (I/O) devices, such as a keyboard, a mouse, and a video display. The IHS 120 may also include one or more buses operable to transmit communications between the various hardware components. In one or more embodiments, IHS 120 is rack-mounted to provide computing, communication and storage functionality in mobile MDC 100. One of IHS 120 may be programmed to perform the role of management controller 117.

IHS 120 includes a network interface, depicted as network interface controller (NIC) 122. NIC 122 is communicatively connected to network 123. Remote device systems 124 are also communicatively connected to network 123. NIC 122 enables IHS 120 and/or components within IHS 120 to communicate and/or interface with other devices, services, and components that are located external to IHS 120. IHS 120 receives IHS updates and work requests from remote device systems 124 via network 123. These devices, services, and components can interface with IHS 120 via an external network, such as network 123, using one or more communication protocols that include transport control protocol (TCP/IP) and network block device (NBD) protocol. Network 123 can be a local area network, wide area network, personal area network, and the like, and the connection to and/or between network 123 and IHS 120 can be wired, wireless, or a combination thereof. For purposes of discussion, network 123 is indicated as a single collective component for simplicity. However, it should be appreciated that network 123 can comprise one or more direct connections to other devices as well as a more complex set of interconnections as can exist within a local area network or a wide area network, such as the Internet.

A processor subsystem 126 is coupled to system memory 127 via system interconnect 128. System interconnect 128 can be interchangeably referred to as a system bus, in one or more embodiments. System interconnect 128 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 128 can also be a Double Data Rate (DDR) memory interface. The system memory 127 can either be contained on separate, removable dual inline memory module (RDIMM) devices or system memory 127 can be contained within persistent memory devices (NVDIMMs). For example, the NVDIMM-N variety of NVDIMMs contain both random access memory, which can serve as system memory 127, and non-volatile memory. It should be noted that other channels of communication can be contained within system interconnect 128, including but not limited to inter-integrated circuit (i2c) or system management bus (SMBus). System interconnect 128 communicatively couples various system components. Examples of system components include replaceable local storage resources 130 (illustrated as "Storage Resources") such as solid state drives (SDDs) and hard disk drives (HDDs). Software and/or firmware modules and one or more sets of data that can be stored on local storage resources 130 and be utilized during operations of IHS 120. Specifically, in one embodiment, system memory 127 can include therein a plurality of such modules, including temperature and pressure control (TPC) application 132, air pressure limiting application 133, other application(s) 134, operating system (OS) 135, a firmware (F/W) interface 136 such as basic input/output system (BIOS) or Uniform Extensible Firmware Interface (UEFI), and platform firmware 137. These software and/or firmware modules have varying functionality when their corresponding program code is executed by processor subsystem 126 or secondary processing devices within IHS 120. For example, other application(s) 134 may include a word processing application and a presentation application, among other applications. System memory 127 can include computer data structures and data values, such as differential air pressure limits 138 that contains upper and/or lower thresholds for differential pressures between cold and hot aisles 116, 120, between exterior and interior of containment wall 115a, and between exterior and interior of containment wall 115b. These data structures and values can be used by applications (132, 133).

IHS 120 further includes one or more input/output (I/O) controllers 140 that support connection by and processing of signals from one or more connected input device/s 141, such as a keyboard, mouse, touch screen, or microphone. I/O controllers 140 also support connection to and forwarding of output signals to one or more connected output devices 142, such as a monitor or display device or audio speaker(s). Additionally, in one or more embodiments, one or more device interfaces 143, such as an optical reader, a universal serial bus (USB), a card reader, Personal Computer Memory Card International Association (PCMCIA) slot, and/or a high-definition multimedia interface (HDMI), can be associated with IHS 120. Device interface(s) 143 can be utilized to enable data to be read from or stored to corresponding removable storage device/s 144, such as a compact disk (CD), digital video disk (DVD), flash drive, or flash memory card. In one or more embodiments, device interface(s) 143 can further include general purpose I/O interfaces such as inter-integrated circuit ($I^2C$), system management bus (SMB), and peripheral component interconnect (PCI) buses.

Enclosure structure 146 refers to a barrier that encompasses an IT space for internally directing supply air. In one or more embodiments, enclosure structure 146 is provided by volumetric container 147. In one or more alternate embodiments, enclosure structure 146 is a building that houses a data center. Environmental subsystem 104, managed by management controller 117 of management system 106, provides cooling air to meet the cooling requirements of IHSs 120. IHSs 120 can be positioned in one or more spaces defined within enclosure structure 146 of MDC 100 for which sensing and cooling is specifically handled by management controller 117. In some instances, environmental subsystem 104 warms the supply air to a specified level required for operation by one or more of the IT components in one or more associated operating states. The cooling/heating requirements can include specified temperature and humidity ranges for startup, standby, and operation of IHSs 120. Operating outside of these ranges can degrade the service life or prevent effective operation of IHSs 120. Environmental subsystem 104 can include air handling system(s), such as stand-alone cooling and heating unit(s) 149, which include heater(s) 150, air handling unit(s) (AHU(s)) 151 and evaporative/mechanical cooling subsystems 152. AHU(s) 151 have mode actuators 154 that configure air flow for one of closed loop recirculation, open loop venting with cooling by outside air, or a mixed mode with a partial recirculation of air. The air is moved by air mover(s) 155 of AHU(s) 151.

Management controller 117 can include some or all of the components and functionality described above for IHSs 120. In one or more embodiments, management controller 117 acts as supervisory controller to respective control unit controllers 156 that control corresponding cooling and heating unit(s) 149 of environmental subsystem 104. In one or more embodiments, management controller 117 executes TCP application 132 and air pressure limiting application 134 to enable MDC 100 to provide the functionality described herein.

In one or more embodiments, IHSs 120 can communicate cooling requirements to management controller 117, via device interface 157. In one or more embodiments, management controller 117 can determine cooling requirements based in part on the received cooling requirements of the IHSs 120 and based on values provided by power consumption monitor 160, rack pressure sensor 161*a*, rack humidity sensor 162*a*, and rack temperature sensor 163*a*. For example, the cooling requirement can indicate a temperature set point and a current temperature of the supply air and a current temperature of the return air. As another example, the cooling requirement can indicate a current heat load being produced by IHSs 120. In one or more embodiments, management controller 117 can determine cooling requirements based in part on outside environmental sensors, depicted as outside pressure sensor 161*b*, outside temperature sensor 162*b*, and outside humidity sensor 163*b*. In one or more embodiments, management controller 117 can determine respective cooling requirements for each of separate zones defined within IT compartment, based in part on cold aisle (CA) environmental sensors depicted as CA pressure sensor 161*c*, CA temperature sensor 162*c*, and CA humidity sensor 163*c* and/or based in part on hot aisle (HA) environmental sensors depicted as HA pressure sensor 161*d*, HA temperature sensor 162*d*, and HA humidity sensor 163*d*. In one or more embodiments, management controller 117 can determine cooling requirements and differential air pressure limiting for OT interior compartment of MMR 114 based in part on MMR environmental sensors depicted as MMR pressure sensor 161*e*, MMR temperature sensor 162*e*, and MMR humidity sensor 163*e*.

In one or more embodiments, management system 106 controls infrastructure support to IHSs 120 in MDC 100, including control of environmental subsystem 104, network subsystem 107, security subsystem 108, fire suppression subsystem 109, and power distribution subsystem 110. Management system 106 can be assigned to control these functions within a particular volumetric container 147. In one or more embodiments, management system 106 controls these functions within an IT space within one or more rooms of a facility. In one or more embodiments, management system 106 is part of IHS 120. In one or more embodiments, management system 106 is part of environmental subsystem 104. In one or more embodiments, management system 106 is at least partially remotely located, such as management functions being performed by remote device system 124. In one or more embodiments, management controller 117 is a programmable logic controller (PLC) that is connected to the other subsystems via one or more interconnects and communication protocols. Management controller 117 interfaces with IHSs 120 and the infrastructure subsystems (104, 107, 108, 109, and 110) and communicates to a network operations center or building management system. Security subsystem 108 monitors user interface device (UID) 170 that is proximate to first access door 118 and UID 172 that is proximate to second access door 119. In one embodiment, vendors for services, such as telecommunication, or other types of services that support operation of one or more of IHSs 120 within IT compartment 103, can have special confirmed security authorization to access low heat-generating components 112 within MMR 114. Employees authorized to service IHSs 120 can also be authorized, whereas other vendors are not authorized. Access to MMR 114 thus requires entry of a specific authorization (security access) code at an access panel, such as UID 172, or locking mechanism of first and second access doors 118, 119, for example. Entry of a correct authorization code at the access panel is communicated to management controller 117. In one or more embodiments, management controller 117 can maintain differential air pressure between an exterior and an interior of each access door (118, 119) below a specific threshold so that excess physical force is not required to open or close the access door (118, 119). In one or more embodiments, the threshold is empirically determined and preset by controller. Additionally, in one or more embodiments, the threshold can be adjustable by an authorized system's technician or other personnel. In one or more embodiments, the threshold is provided as a range of pressure values between an upper and lower value, within which the differential pressure is considered acceptable. In one or more embodiments, the timing of the access to and/or use of MMR 114 is preset and provided to management controller 117, and management controller 117 is programmed to perform the pressure balancing operations (to bring the differential pressure value below the threshold) prior to the personnel arriving at the access door 118, 119.

In one or more embodiments, management controller 117 responds to user authorization received by UID 170 by equalizing pressure between cold aisle 111 and the interior space of MMR 114 to facilitate opening and closing first access door 118. For example, air flow regulation device(s) 116 positioned in supply air passage(s) 174 through containment wall 115*a* can be moved to a more open position (to allow for more cooling air flow into MMR) and air flow regulation device(s) 116 positioned in return air passage(s) 176 in containment wall 115*b* can be moved into a more closed position, or vice-versa (depending on the directional swing of the access door(s)).

In one or more embodiments, management controller 117 responds to user authorization received by UID 172 by equalizing pressure between hot aisle 121 and the interior of MMR 114 to facilitate opening and closing second access door 119. For example, air flow regulation device(s) 116 positioned in supply air passage(s) 174 through containment wall 115*a* can be closed and/or air flow regulation device(s) 116 in in return air passage(s) 176 through containment wall 115*b* can be opened.

In one or more embodiments, some supply air passages 174 are open perforations that are not regulated. In one or more embodiments, some return air passages 176 are open perforations that are not regulated. Differential air pressure is regulated by adjusting air flow through selected return air passage(s) 176 and/or selected supply air passage(s) 174. For example, the always open supply air passages 174 or return air passages 176 prevent inadvertently closing all airflow, such as due to a failed air flow regulation device 116.

In one or more embodiments, environmental subsystem 104 detects, via input from air sensors, an outside ambient condition as being in one of multiple environmental condition ranges. In one or more embodiments, the environmental condition ranges are defined on a psychrometric chart that is tailored for a location of the data center. In an illustrative embodiment, environmental subsystem 104 is equipped to operate in one of four cooling modes defined by environmental condition ranges that are mutually exclusive and which cover the full range of environmental conditions that MDC 100 should encounter at the operational location. First, a "normal mode" provides open loop cooling using outside air. Second, a "mixed mode" provides mixing outside air with recirculated return air that is warmed by the data center. Third, a "mechanical trim mode" includes mixing of outside air with recirculated return air. Fourth, a "closed mode" recirculates all return air with cooling provided by the mechanical cooling subsystem. In one or more embodiments, fewer modes may be required for a particular location. Other environmental considerations such as the amount of contaminants in the outside air can affect mode selection, including reverting to closed loop cooling. The ranges of environmental conditions are based at least on outside air temperature and outside air humidity.

Figure 2:
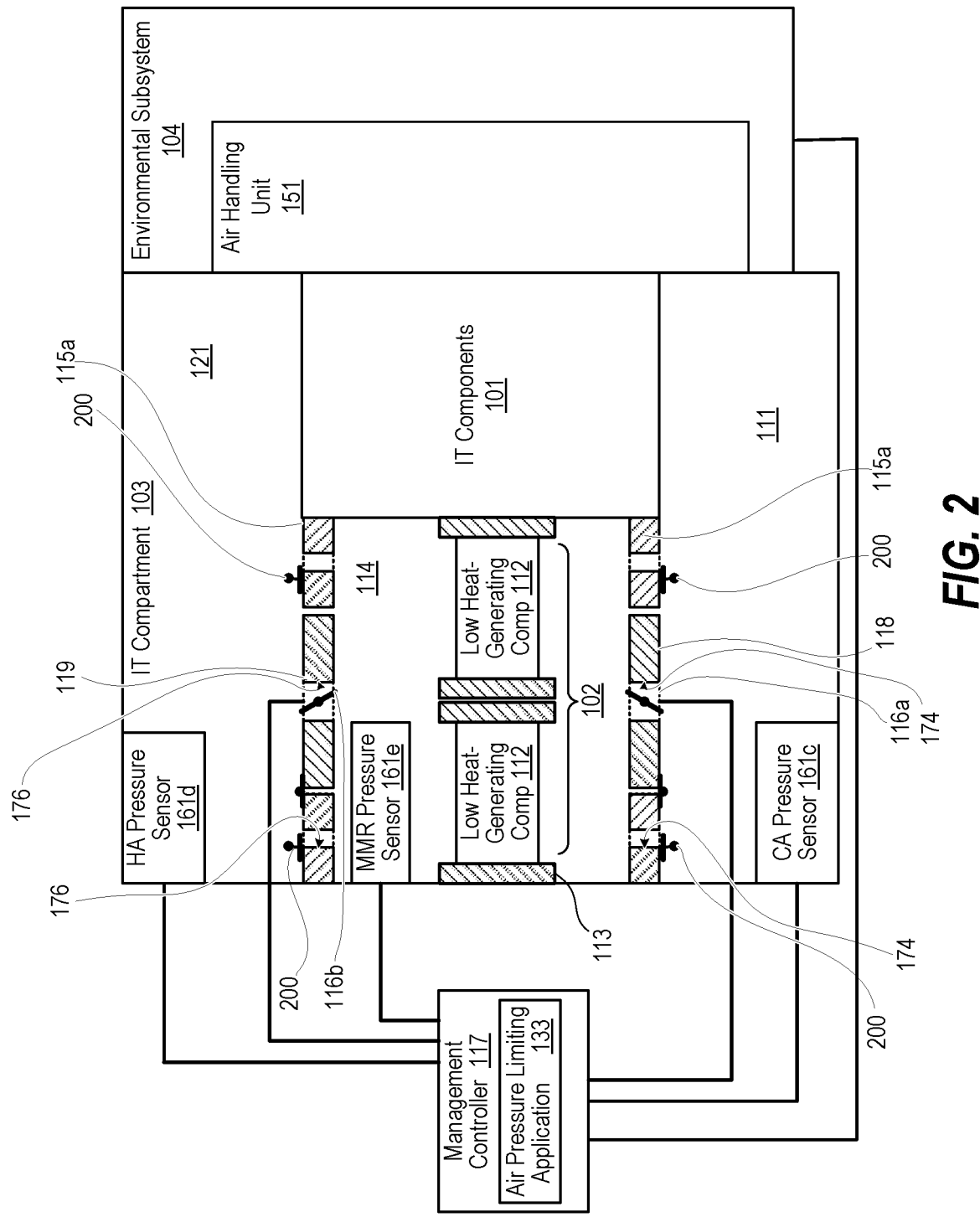
FIG. 2 depicts simplified diagram of differential air pressure control by a management controller that regulates supply air provided to an operation technology (OT) interior compartment of MDC, according to one or more embodiments.

FIG. 2 depicts a simplified diagram of differential air pressure control by management controller 117, which regulates supply air provided to an OT interior compartment (MMR 114) within IT compartment 103 of MDC 100. The IT compartment 103 has cold aisle 111 and hot aisle 121. The OT interior compartment, depicted as MMR 114, is positioned in IT compartment 103 between cold aisle 111 and hot aisle 121. First access door 118 in containment wall 115*a* selectively opens to provide access to MMR 114 and/or to OT components 102 in MMR 114. OT components 102 are presented as low heat-generating components 112 in open two-post racks 113. In one or more embodiments, first access door 118 faces cold aisle 111. Second access door 119 in containment wall 115*b* faces hot aisle 121 and selectively opens to provide access to MMR 114 and/or to OT components 102. Environmental subsystem 104 has AHU 151 that provides supply air to cold aisle 111 and that draws return air from hot aisle 121 to moderate or cool a temperature of IT components 101 and OT components 102. Supply air passage(s) 174 guides supply air from cold aisle 111 into MMR 114. Return air passage(s) 176 guides air from MMR 114 to hot aisle 121. In one or more embodiments, air flow regulation devices 116*a*-116*b* are positioned respectively in one air passage 174 and one return air passage 176. Management controller 117 monitors CA pressure sensor 161*c* and MMR pressure sensor 161*e* to respectively receive air pressure values external and internal to first access door 118. Management controller 117 determines a first differential air pressure value as the difference in the external and internal air pressure values. Management controller 117 monitors HA pressure sensor 161*d* and MMR pressure sensor 161*e* to respectively receive air pressure values external and internal to second access door 119. Management controller 117 determines a second differential air pressure value as the difference between the external and internal air pressure values. Management controller 117 compares the first differential air pressure value to a first pressure threshold and compares the second differential air pressure value to a second pressure threshold. In response to determining that either the first or the second differential air pressure values is greater, respectively, than the first and the second pressure thresholds, management controller 117 actuates one or more of air flow regulation device 116*a*, 116*b* to reduce the corresponding one of the first and the second differential air pressure values. The reduction in the differential air pressure values is performed to enable opening of first access door 118 and/or second access door 119, respectively, without requiring excess physical force. Environmental subsystem 104 assists in maintaining the differential pressures of MMR 114 within limits by maintaining a differential air pressure between cold aisle 111 and hot aisle 121. In one embodiment, manual dampers 200 are provided to enable static air pressure tuning for MMR 114.

Figure 3:
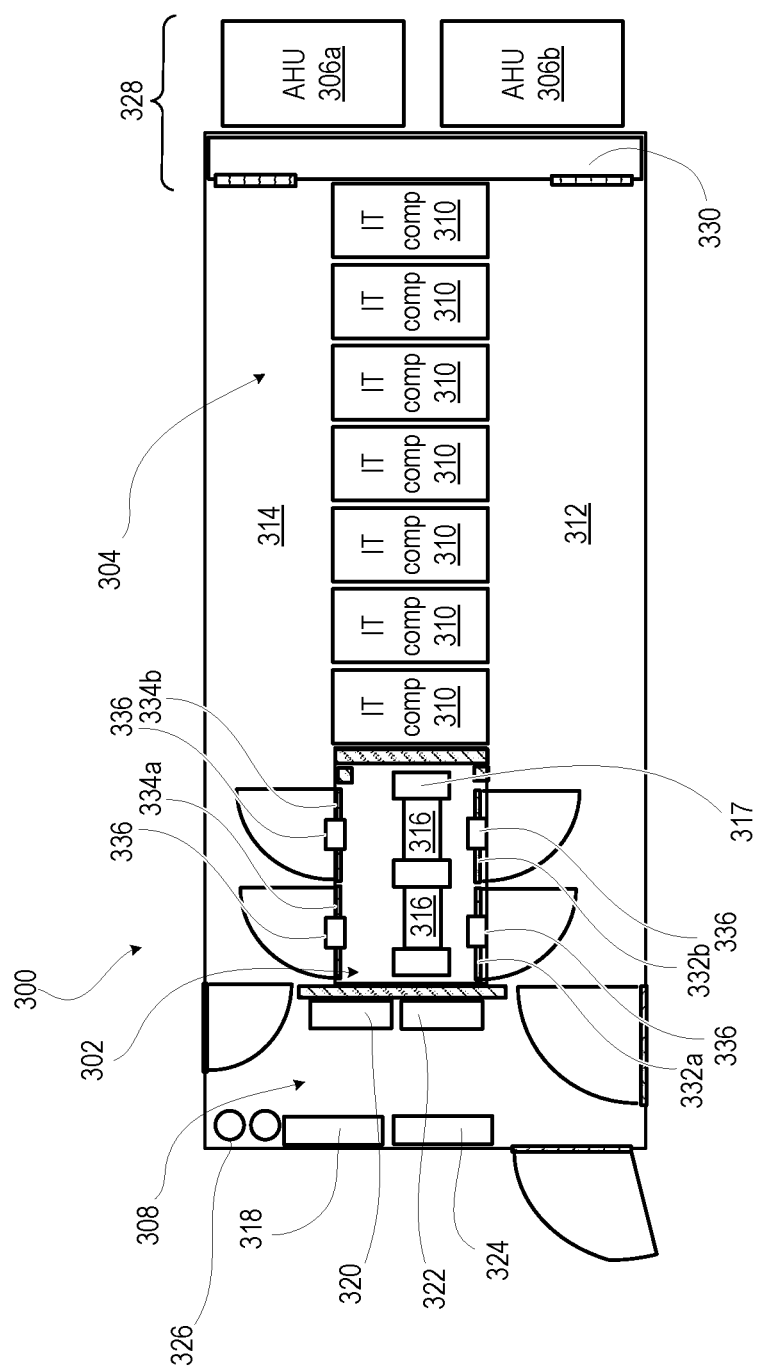
FIG. 3 is a block diagram depiction of example modular edge data center (MEDC) that limits differential air pressure within a meet me room (MMR) positioned within an information technology (IT) compartment, according to one or more embodiments.

FIG. 3 is a block diagram depiction of example modular edge data center (MEDC) 300 that includes components for modulating/limiting differential air pressure within MMR 302 positioned within IT compartment 304. MEDC 300 is an implementation of and can include similar or identical components described for MDC 100 (FIG. 1). In addition to IT compartment 304 and MMR 302, MEDC 300 is configured with utility room 308. IT compartment 304 includes a longitudinal row of IT components 310 between cold and hot aisles 312, 314. MMR 302 includes vendor service cabinets 316 in open, two post racks 317 for IT and/or OT equipment, such as for network services, telecommunication services, etc. In one or more embodiments, MMR 302 can limit access to particular vendors or particular authorized employees/personnel. IT compartment 304 and utility room 105 can have different access limitations. MMR 302 can also provide an on-site meeting location for personnel. Utility room 308 includes infrastructure support, such as power input panel 318, security panel 320, control panel 322, modular data center interconnect (MDCI) graphical user interface (GUI) console 324, and fire suppression equipment 326. MEDC 300 has two end-mounted AHUs 306*a*-306*b* providing cooling to interior space of MEDC 300. Dual-AHU air handling system 328 of MEDC 300 includes two forward-mounted or aft-mounted AHUs 306*a*-306*b*, with the directional placement of the AHUs being interchangeable in different designs. AHUs 306*a*-306*b* exchange cooling air, via air redirection structure 330, connecting cold and hot aisles 312, 314 with IT compartment 304, MMR 302, and utility room 308. MMR 302 includes first access doors 332*a*-332*b* facing cold aisle 312 and second access doors 334*a*-334*b* facing hot aisle 314. In one or more embodiments, each access door 332*a*-332*b*, 334*a*-334*b* includes at least one air flow regulation device 336. Generally, access to MMR 302 would occur through one of access doors 332*a*-332, 334*a*-334*b* at a time. Having access doors 332*a*-332, 334*a*-334*b* on an opposite side of MMR 302 remain closed avoids a significant amount of air flow through MMR, preventing the airflow from bypassing IT components 310.

Figure 4:
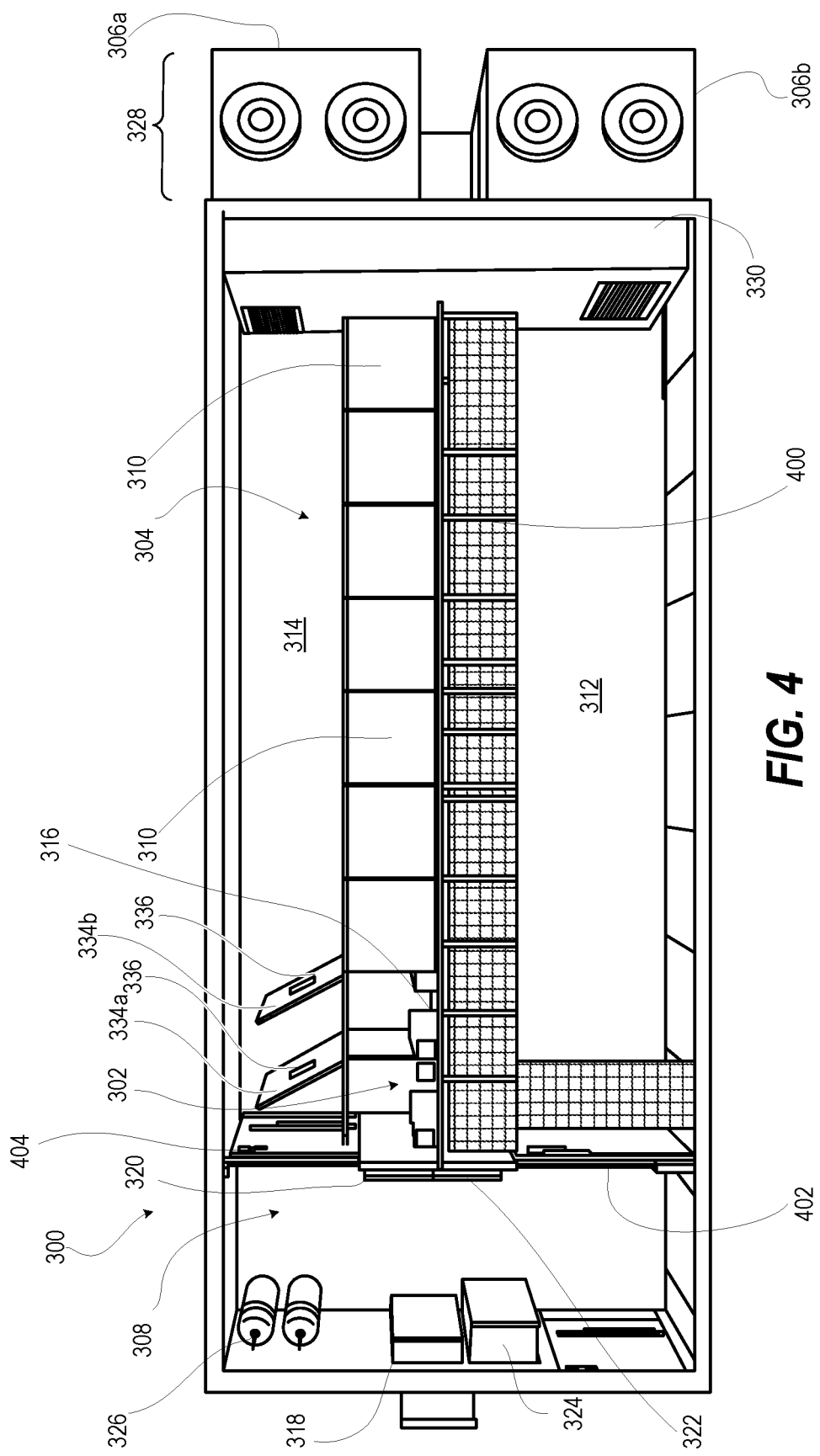
FIG. 4 depicts a top three-dimensional view of an example MDC that includes MMR in an IT compartment, according to one or more embodiments.

FIG. 4 depicts a top three-dimensional view of example MEDC 300 that includes MMR 302 in IT compartment 304.

Access doors 334a-334b are open and each include air flow regulation device 336. Cable trays 400 are provided above MMR 302, IT components 310 and cold aisle 312 to provide electrical and communication connections. Door 402 between utility room 308 and cold aisle 312 is closed. Door 404 between utility room 308 and hot aisle 314 is closed. In one or more embodiments, doors 334a-334b swing outward from MMR 302 because insufficient space may exist for the doors 334a-334b to swing inward. Aspects of the present disclosure can be used for inward swinging doors. Being on the return side, doors 334a-334b would tend to blown open if high differential pressure existed within MMR 302. Reducing this pressure also reduces forces on door latch mechanisms, avoid mechanical failure. Reducing this pressure also avoids abrupt outward swinging of the door.

Figure 5A:
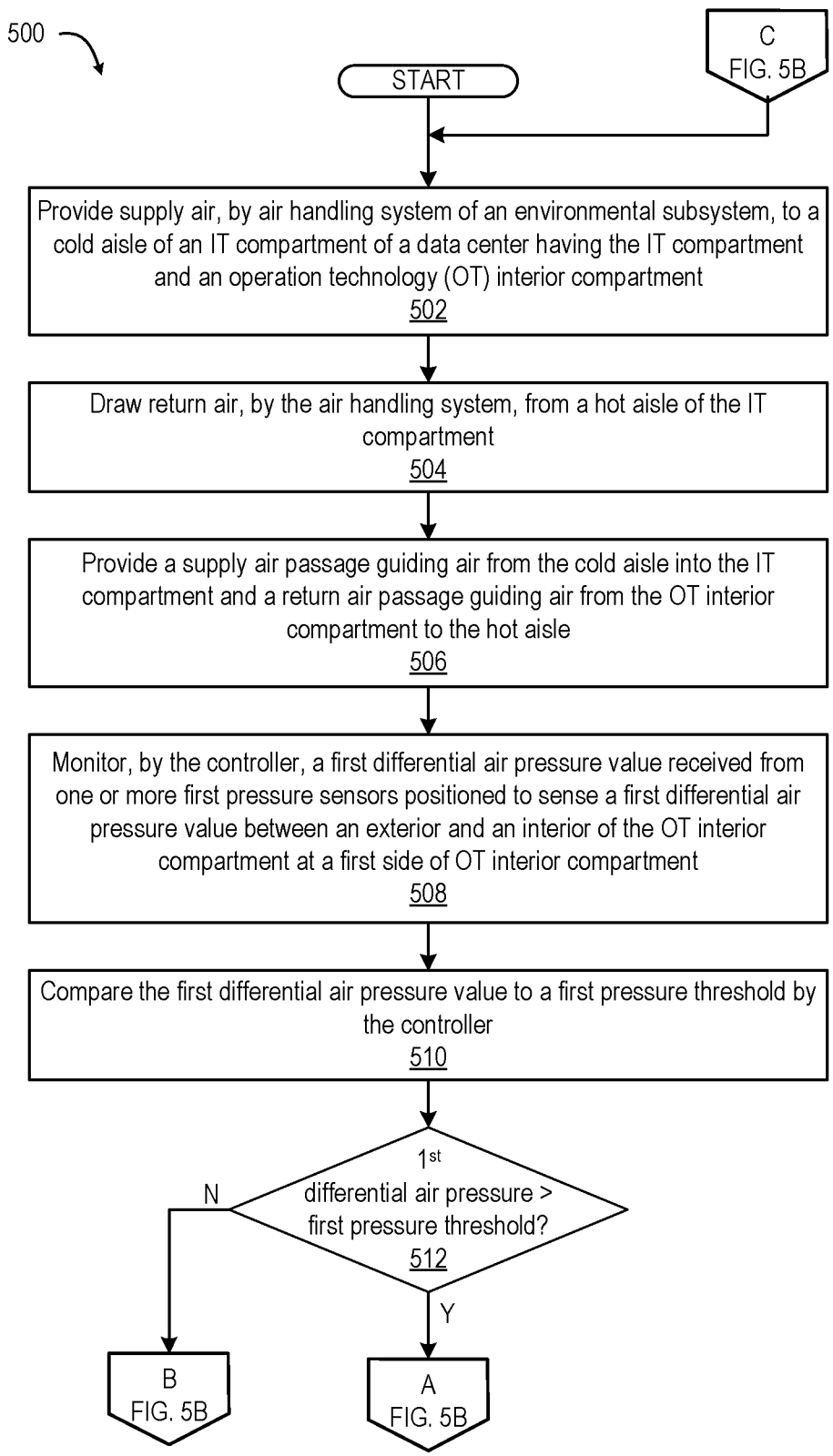
FIGS. 5A-5B (FIG. 5) presents a flow diagram of a method for regulating pressure of supply air provided to an interior compartment within an IT space of a data center, according to one or more embodiments.
Figure 5B:
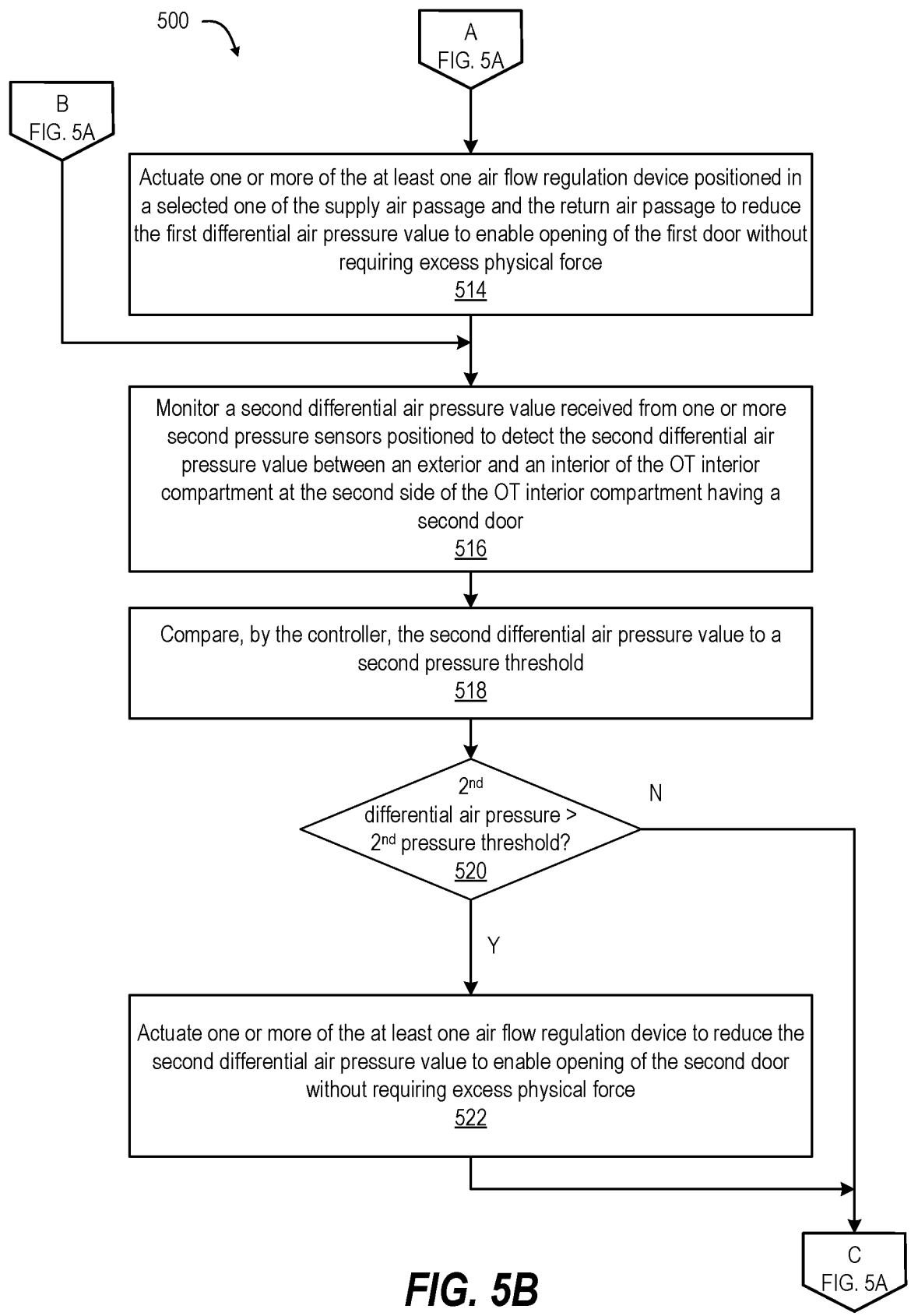

FIGS. 5A-5B (FIG. 5) presents a flow diagram of method 500 for regulating interior air pressure and amount/flow of supply air provided to an interior compartment within an IT space of a data center. The description of method 500 is provided with general reference to the specific components illustrated within the preceding FIGS. 1-4. In at least one embodiment, method 500 can be implemented using management controller 117 (FIG. 1) that operates environmental subsystem 104 (FIG. 1). With reference to FIG. 5A, method 500 includes providing supply air, by air handling system of an environmental subsystem, to a cold aisle of an IT compartment of a data center having the IT compartment and an operation technology (OT) interior compartment (block 502). Method 500 includes drawing return air, by the air handling system, from a hot aisle of the IT compartment (block 504). Method 500 includes providing a supply air passage guiding air from the cold aisle into the OT interior compartment and a return air passage guiding air from the OT interior compartment to the hot aisle (block 506). Method 500 includes monitoring, by the controller, a first differential air pressure value received from one or more first pressure sensors positioned to sense a first differential air pressure value between an exterior and an interior of the OT interior compartment at a first side of OT interior compartment (block 508). The first side of OT interior compartment has a first door that that selectively opens the OT interior compartment to provide access to the inside of the OT interior compartment from a first side of the OT interior compartment facing a selected one of the cold aisle and the hot aisle. Method 500 includes comparing the first differential air pressure value to a first pressure threshold by the controller (block 510). A determination is made, in decision block 512, whether the first differential air pressure is greater than the first pressure threshold.

With reference to FIG. 5B, in response to determining that the first differential air pressure is greater than the first pressure threshold, method 500 includes actuating one or more of the at least one air flow regulation device, positioned in a selected one of the supply air passage and the return air passage, to reduce the first differential air pressure value and thus enable opening of the first door without requiring excess physical force (block 514). In response to determining that the first differential air pressure is not greater than the first pressure threshold in decision block 512 or after performing block 514, method 500 includes monitoring a second differential air pressure value received from one or more second pressure sensors positioned to detect the second differential air pressure value between an exterior and an interior of the OT interior compartment at the second side of the OT interior compartment having a second door (block 516). In one or more embodiments, the second side faces the other one of cold aisle and the hot aisle as compared to the first side. Method 500 includes comparing, by the controller, the second differential air pressure value to a second pressure threshold (block 518). A determination is made, in decision block 520, whether the second differential air pressure is greater than the second pressure threshold. In response to determining that the second differential air pressure is not greater than the second pressure threshold, method 500 returns to block 502 (FIG. 5A). In response to determining that the second differential air pressure is greater than the second pressure threshold, method 500 includes actuating one or more of the at least one air flow regulation device to reduce the second differential air pressure value to enable opening of the second door without requiring excess physical force (block 522). Then method 500 returns to block 502 (FIG. 5A). According to the embodiments presented by method 500, method 500 maintains differential pressures to avoid damage to containment walls 115a-115b and access doors 118, 119 (FIG. 1), even when no personnel is seeking access to MMR 114.

Figure 6:
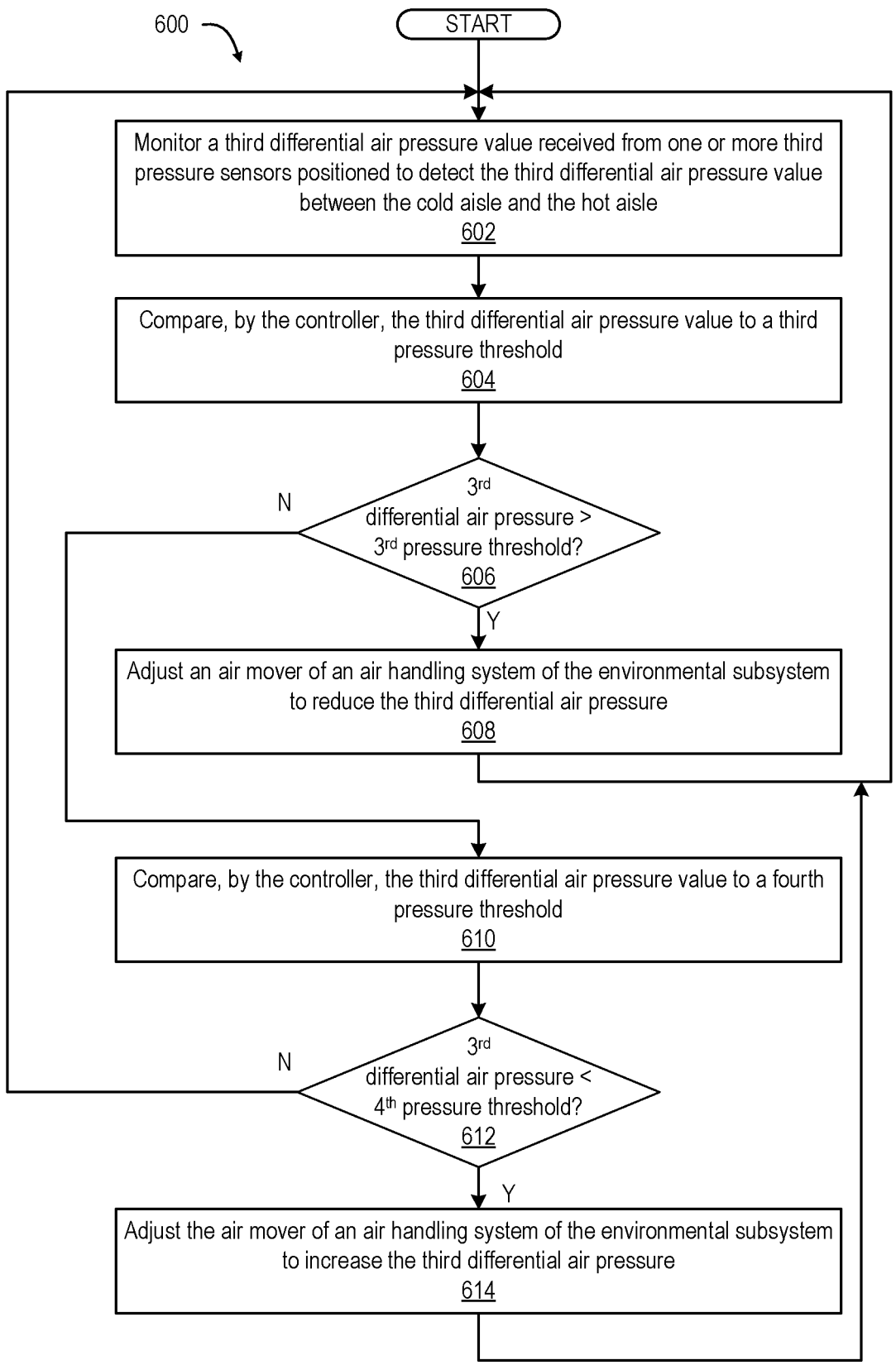
FIG. 6 presents a flow diagram of a method for managing air pressure in a data center, according to one or more embodiments.

FIG. 6 presents a flow diagram of method 600 for managing air pressure in a data center. The description of method 600 is provided with general reference to the specific components illustrated within the preceding FIGS. 1-4. In at least one embodiment, method 600 operates in parallel with method 500 (FIG. 5). In at least one embodiment, method 600 can be implemented using management controller 117 (FIG. 1) that operates environmental subsystem 104 (FIG. 1). Method 600 includes monitoring a third differential air pressure value received from one or more third pressure sensors positioned to detect the third differential air pressure value between the cold aisle and the hot aisle (block 602). Method 600 includes comparing, by the controller, the third differential air pressure value to a third pressure threshold (block 604). A determination is made, in decision block 606, whether the third differential air pressure is greater than the third pressure threshold. In response to determining that the third differential air pressure is greater than the third pressure threshold, method 600 includes adjusting settings of an air mover of an air handling system of the environmental subsystem to reduce the third differential air pressure (block 608). Then method 600 proceeds to block 602.

In response to determining that the third differential air pressure is not greater than the third pressure threshold, method 600 includes comparing, by the controller, the third differential air pressure value to a fourth pressure threshold that is less than the third pressure threshold (block 610). A determination is made, in decision block 612, whether the third differential air pressure is less than the fourth pressure threshold. In response to determining that the third differential air pressure is not less than the fourth pressure threshold, method 600 proceeds to block 602. In response to determining that the third differential air pressure is less than the fourth pressure threshold, method 600 includes adjusting the setting of the air mover of the air handling system of the environmental subsystem to increase the third differential air pressure (block 614). The third differential air pressure causes movement of the supply air to moderate or cool a temperature of the one or more IT components and the one or more OT components positioned between the cold aisle and the hot aisle. Then method 600 proceeds to block 602.

Figure 7A:
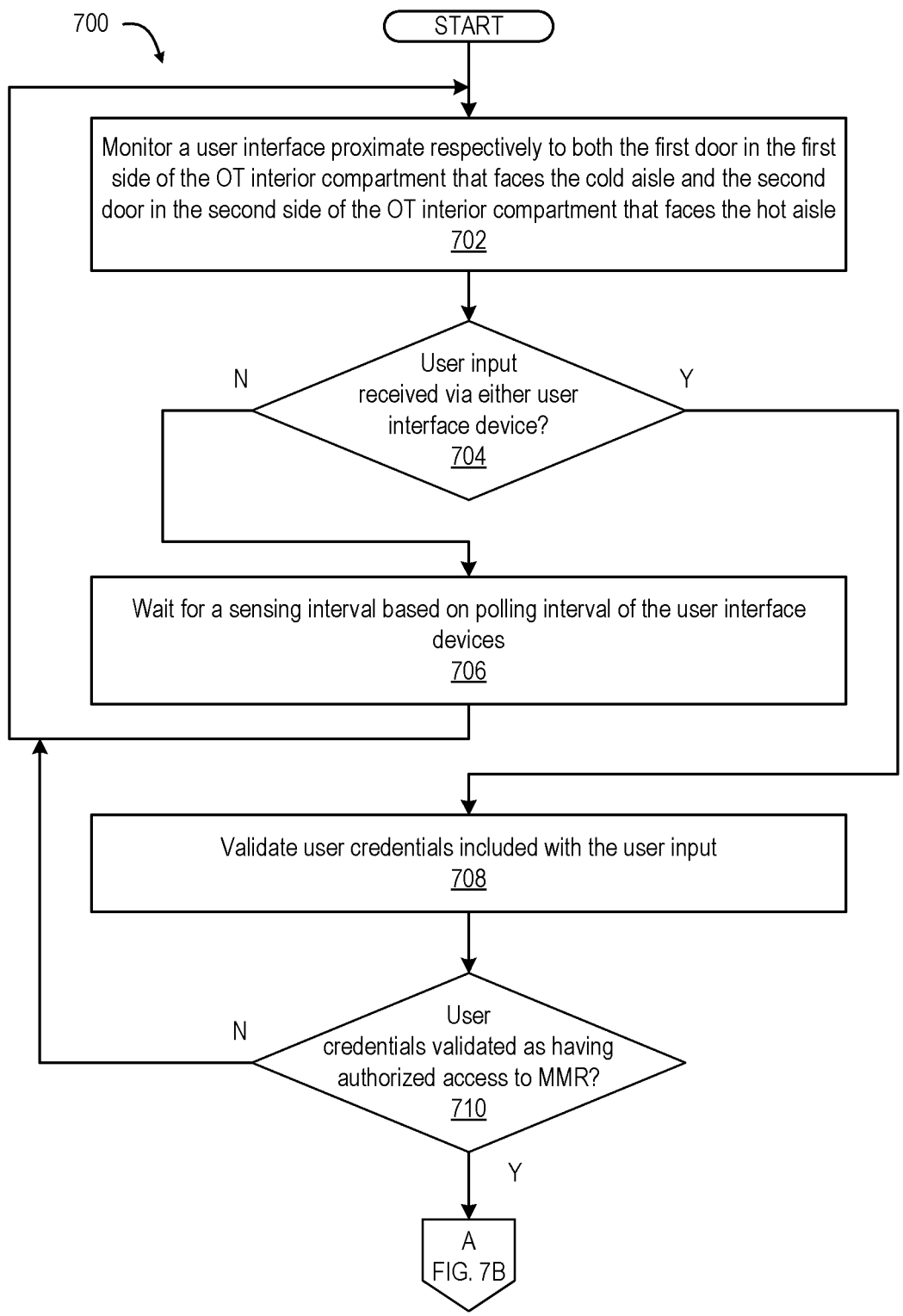
FIGS. 7A-7B (FIG. 7) present a flow diagram of a second, alternate method for managing air pressure in a data center, according to one or more embodiments.
Figure 7B:
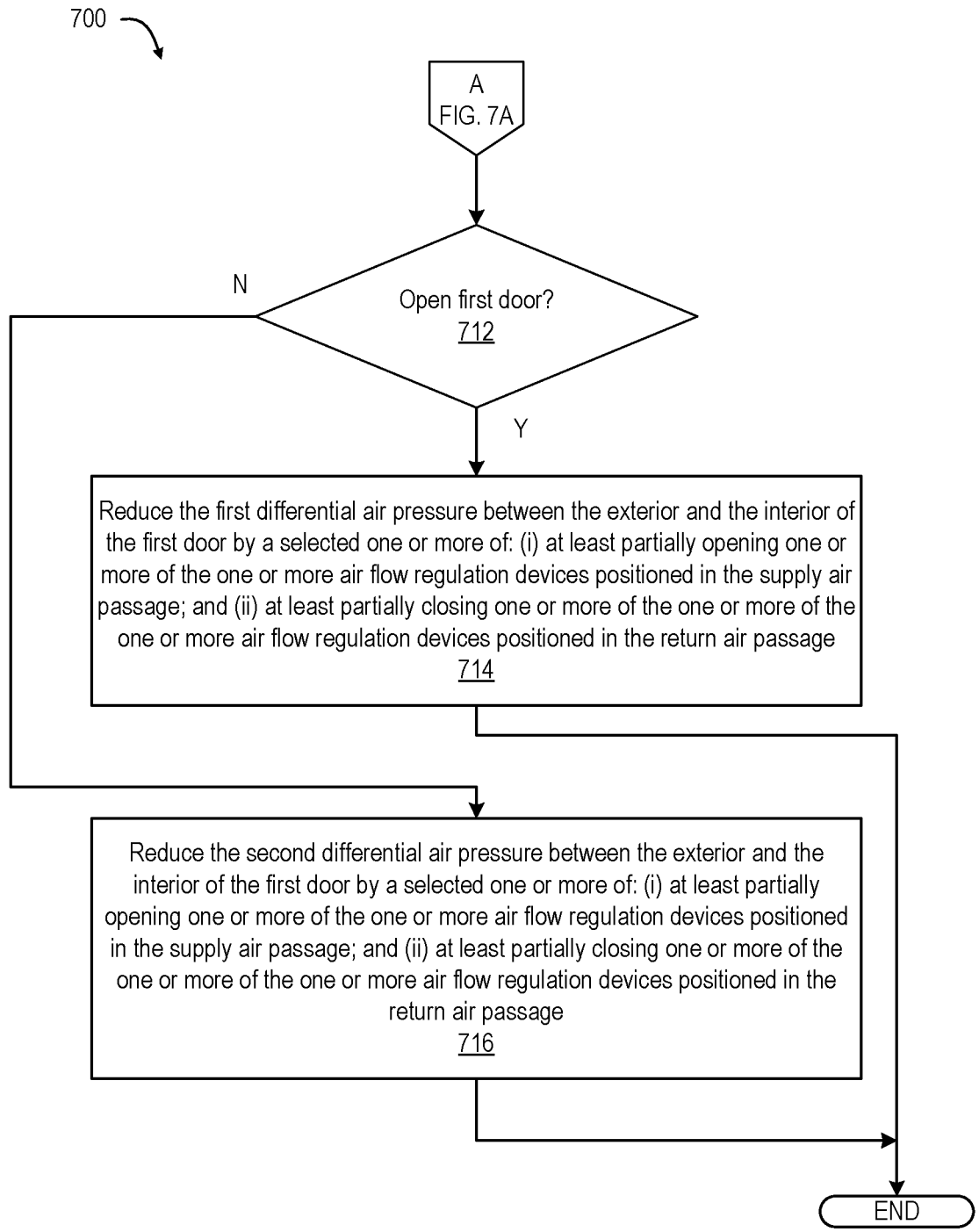

FIGS. 7A-7B (FIG. 7) present a flow diagram of method 700 for managing air pressure in a data center. The description of method 700 is provided with general reference to the specific components illustrated within the preceding FIGS. 1-4. In at least one embodiment, method 700 operates in parallel with method 500 (FIG. 5) and 600 (FIG. 6). In at least one embodiment, method 700 can be implemented using management controller 117 (FIG. 1) that operates environmental subsystem 104 (FIG. 1). With reference to FIG. 7A, method 700 provides for operating MMR 114 (FIG. 1) for a brief period as an air lock by responding to a request to open a door on either the supply side or the return side by equalizing pressure to the corresponding exterior side. Method 700 avoids having doors on both sides of the MMR 114 (FIG. 1) open at the same time, which would cause an excessive amount of air flow to bypass IT components 310 (FIG. 3). Method 700 includes monitoring for a user input at user interface devices proximate respectively to both the first door in the first side of the OT interior compartment that faces the cold aisle and the second door in the second side of the OT interior compartment that faces the hot aisle (block 702). A determination is made, in decision block 704, whether user input is received via either user interface device. In response to determining that no user input is received via either user interface device, method 700 includes waiting for a sensing interval based on polling interval of the user interface devices (block 706). Then method 700 returns to block 702.

In response to determining that a user input is received via either user interface device, method 700 includes validating user credentials included with the user input (block 708). Examples of user credentials include passcodes, facial recognition, computer access card (CAC), voice recognition, fingerprint recognition, retina scan, etc. A determination is made, in decision block 710, whether the user credentials are validated as having authorized access to the MMR. In response to determining that the user credentials are not validated as having authorized access, method 700 returns to block 706.

With reference to FIG. 7B, in response to determining that the user credentials are validated as having authorized access, a determination is made, in decision block 712, whether the authorized access received is to open the first door. In response to determining that authorization received is to open the first door, method 700 includes reducing the first differential air pressure between the exterior and the interior of the first door by a selected one or more of: (i) at least partially opening one or more of the one or more air flow regulation devices positioned in the supply air passage; and (ii) at least partially closing one or more of the one or more of the one or more air flow regulation devices positioned in the return air passage (block 714). Then method 700 ends. The specific method of deciding how to modify the level of openness or closeness of air flow regulation device(s)) can be performed using any one of available method and all such methods covered by the disclosure.

At decision block 712, in response to determining that the authorization received is not to open the first door, but instead to open the second door, method 700 includes reducing the second differential air pressure between the exterior and the interior of the second door by a selected one or more of: (i) at least partially closing one or more of the one or more air flow regulation devices positioned in the supply air passage; and (ii) at least partially opening one or more of the one or more of the one or more air flow regulation devices positioned in the return air passage (block 716). In one or more embodiments, controller continues to monitor the differential pressure. After the differential pressure is determined by controller to be below the threshold or within the threshold ranges, access to open the corresponding door is provided, and the door's locking mechanism is removed or opened. In one or more embodiments, a signal may be provided to the person requesting access that access is approved. The signal may be presented via the user interface device. Then method 700 ends.

In the above described flow charts, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A data center that regulates pressure of supply air provided to an interior compartment within an information technology (IT) space, the data center comprising:
   an information technology (IT) compartment having a cold aisle and a hot aisle;
   an operation technology (OT) interior compartment positioned inside the IT compartment between the cold aisle and the hot aisle, the OT interior compartment being a separate room comprising containment walls separating an interior of the OT interior compartment from a remainder of the IT compartment and a first door that selectively opens to enable entry by one or more personnel into the OT interior compartment and provide access to one or more OT components installed within the OT interior compartment, the access provided from a first side of the OT interior compartment facing a selected one of the cold aisle and the hot aisle; and
   an environmental subsystem comprising:
      an air handling system that provides supply air to the cold aisle and that draws return air from the hot aisle to moderate or cool a temperature of one or more IT components and one or more OT components that are installed within the IT compartment and OT interior compartment, respectively;
      a supply air passage that guides air from the cold aisle into the OT interior compartment;
      a return air passage that guides air from the OT interior compartment to the hot aisle;
      at least one air flow regulation device positioned in a selected one of the supply air passage and the return air passage;
      one or more first pressure sensors positioned to sense a first differential air pressure value between an exterior and an interior of the OT interior compartment at the first side of OT interior compartment;
      a memory containing an air pressure limiting application; and
      a controller that is communicatively coupled to the at least one air flow regulation device and the memory, the controller executing the air pressure limiting application to enable the environmental subsystem to:
         monitor the first differential air pressure value received from the one or more first pressure sensors;
         compare the first differential air pressure value to a first pressure threshold; and
         in response to determining that the first differential air pressure is greater than the first pressure threshold, actuate one or more of the at least one air flow regulation device to reduce the first differential air pressure value to enable opening of the first door.

2. The data center of claim 1, wherein:
   the supply air passage comprises perforations through a portion of a containment wall of the OT interior compartment facing the cold aisle; and
   the at least one air flow regulation device is positioned in the return air passage.

3. The data center of claim 1, wherein the first side of the OT interior compartment faces the cold aisle.

4. The data center of claim 1, wherein the first side of the OT interior compartment faces the hot aisle.

5. The data center of claim 4, further comprising:
   a second door that is located in a containment wall on a second side of the OT interior compartment that faces the cold aisle; and
   one or more second pressure sensors positioned to detect a second differential air pressure value between an exterior and an interior of the OT interior compartment at the second side of the OT interior compartment;

wherein the controller executes the air pressure limiting application to enable the environmental subsystem to:
monitor the second differential air pressure value received from the one or more second pressure sensors;
compare the second differential air pressure value to a second pressure threshold; and
in response to determining that the second differential air pressure is greater than the second pressure threshold, actuate the at least one air flow regulation device to reduce the second differential air pressure value to enable opening of the second door without requiring excess physical force.

6. The data center of claim 1, further comprising:
the one or more IT components installed within the IT compartment between the cold aisle and the hot aisle; and
the one or more OT components installed within the OT internal compartment.

7. An environmental subsystem that regulates pressure of supply air provided to an interior compartment within an information technology (IT) space of a data center, the environmental subsystem comprising:
an operation technology (OT) interior compartment positioned inside an IT compartment between a cold aisle and a hot aisle, the OT interior compartment being a separate room comprising containment walls separating an interior of the OT interior compartment from a remainder of the IT compartment and a first door that selectively opens to enable entry by one or more personnel into the OT interior compartment and provide access to one or more OT components installed within the OT interior compartment, the access provided from a first side of the OT interior compartment facing a selected one of the cold aisle and the hot aisle;
an air handling system that provides supply air to the cold aisle and that draws return air from the hot aisle of the IT compartment to moderate or cool a temperature of one or more IT components and the one or more OT components that are installed within the IT compartment and the OT interior compartment, respectively;
a supply air passage that guides air from the cold aisle into the OT interior compartment;
a return air passage that guides air from the OT interior compartment to the hot aisle;
at least one air flow regulation device positioned in a selected one of the supply air passage and the return air passage;
one or more first pressure sensors positioned to sense a first differential air pressure value between an exterior and an interior of the OT interior compartment at the first side of OT interior compartment;
a memory containing an air pressure limiting application; and
a controller that is communicatively coupled to the at least one air flow regulation device and the memory, the controller executing the air pressure limiting application to enable the environmental subsystem to:
monitor the first differential air pressure value received from the one or more first pressure sensors;
compare the first differential air pressure value to a first pressure threshold; and
in response to determining that the first differential air pressure is greater than the first pressure threshold, actuate one or more of the at least one air flow regulation device to reduce the first differential air pressure value to enable easier opening of the first door.

8. The environmental subsystem of claim 7, wherein:
the supply air passage comprises perforations through a portion of a containment wall of the OT interior compartment facing the cold aisle; and
the at least one air flow regulation device is positioned in the return air passage.

9. The environmental subsystem of claim 7, wherein the first side of the OT interior compartment faces the cold aisle.

10. The environmental subsystem of claim 7, wherein the first side of the OT interior compartment faces the hot aisle.

11. The environmental subsystem of claim 10, further comprising:
a second door that is located in a containment wall on a second side of the OT interior compartment that faces the cold aisle; and
one or more second pressure sensors positioned to detect a second differential air pressure value between an exterior and an interior of the OT interior compartment at the second side of the OT interior compartment;
wherein the controller executes the air pressure limiting application to enable the environmental subsystem to:
monitor the second differential air pressure value received from the one or more second pressure sensors;
compare the second differential air pressure value to a second pressure threshold; and
in response to determining that the second differential air pressure is greater than the second pressure threshold, actuate the at least one air flow regulation device to reduce the second differential air pressure value to enable opening of the second door without requiring excess physical force.

12. A method for regulating pressure of supply air provided to an interior compartment within an information technology (IT) space of a data center, the method comprising:
providing supply air, by an air handling system of an environmental subsystem, to a cold aisle of an IT compartment of a data center having the IT compartment and an operation technology (OT) interior compartment, the OT interior compartment being a separate room comprising containment walls separating an interior of the OT interior compartment from a remainder of the IT compartment and a first door that selectively opens to enable entry by one or more personnel into the OT interior compartment and provide access to one or more OT components installed within the OT interior compartment, the access provided from a first side of the OT interior compartment facing a selected one of the cold aisle and the hot aisle;
drawing return air, by the air handling system, from a hot aisle of the IT compartment;
providing a supply air passage guiding air from the cold aisle into the IT compartment and a return air passage guiding air from the OT interior compartment to the hot aisle;
monitoring a first differential air pressure value received from one or more first pressure sensors positioned to sense a first differential air pressure value between an exterior and an interior of the OT interior compartment at a first side of OT interior compartment having a first door that selectively opens the OT interior compartment to provide access to the inside of the OT interior compartment from a first side of the OT interior compartment facing a selected one of the cold aisle and the hot aisle;

comparing the first differential air pressure value to a first pressure threshold by a controller; and in response to determining that the first differential air pressure is greater than the first pressure threshold, actuating one or more air flow regulation device positioned in a selected one of the supply air passage and the return air passage to reduce the first differential air pressure value to enable opening of the first door.

13. The method of claim 12, wherein:

the supply air passage comprises perforations through a portion of a containment wall of the OT interior compartment facing the cold aisle; and the at least one air flow regulation device is positioned in the return air passage.

14. The method of claim 12, wherein the first side of the OT interior compartment faces the cold aisle.

15. The method of claim 14, further comprising:

monitoring a user interface proximate to the first door in the first side of the OT interior compartment that faces the cold aisle; and in response to determining that authorization is received via the user interface device to open the first door, reducing the first differential air pressure between the exterior and the interior of the first door by a selected one or more of: (i) opening one or more of the one or more air flow regulation devices positioned in the supply air passage; and (ii) closing one or more of the one or more of the one or more air flow regulation devices positioned in the return air passage.

16. The method of claim 12, wherein the first side of the OT interior compartment faces the hot aisle.

17. The method of claim 16, further comprising:

monitoring a user interface proximate to the first door in the first side of the OT interior compartment that faces the hot aisle; and in response to determining that authorization is received via the user interface device to open the first door, reducing the first differential air pressure between the exterior and the interior of the first door by a selected one or more of: (i) closing one or more of the one or more air flow regulation devices positioned in the supply air passage; and (ii) opening one or more of the one or more of the one or more air flow regulation devices positioned in the return air passage.

18. The method of claim 16, further comprising:

monitoring a second differential air pressure value received from one or more second pressure sensors positioned to detect the second differential air pressure value between an exterior and an interior of the OT interior compartment at the second side of the OT interior compartment having a second door;

comparing, by a controller, the second differential air pressure value to a second pressure threshold; and in response to determining that the second differential air pressure is greater than the second pressure threshold, actuating one or more of the at least one air flow regulation device to reduce the second differential air pressure value to enable opening of the second door without requiring excess physical force.

19. The method of claim 12, further comprising:

monitoring a next differential air pressure value received from one or more third pressure sensors positioned to detect the next differential air pressure value between the cold aisle and the hot aisle;

comparing, by the controller, the next differential air pressure value to a next pressure threshold and to an additional pressure threshold that is less than the next pressure threshold;

in response to determining that the next differential air pressure is greater than the next pressure threshold, adjusting an air mover of an air handling system of the environmental subsystem to reduce the next differential air pressure; and in response to determining that the next differential air pressure is less than the additional pressure threshold, adjusting the air mover of an air handling system of the environmental subsystem to increase the next differential air pressure, wherein the next differential air pressure results in movement of the supply air to moderating or cooling a temperature of the one or more IT components and the one or more OT components positioned between the cold aisle and the hot aisle.

* * * * *